United States Patent
Wang

(10) Patent No.: US 8,183,580 B2
(45) Date of Patent: May 22, 2012

(54) THERMALLY-ENHANCED HYBRID LED PACKAGE COMPONENTS

(75) Inventor: Chung Yu Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 270 days.

(21) Appl. No.: 12/715,872

(22) Filed: Mar. 2, 2010

(65) Prior Publication Data

US 2011/0215361 A1    Sep. 8, 2011

(51) Int. Cl.
*H01L 27/15* (2006.01)
*H01L 31/12* (2006.01)
*H01L 33/00* (2010.01)

(52) U.S. Cl. .......... 257/79; 257/698; 257/E33.001; 257/E31.127

(58) Field of Classification Search .......... 257/79, 257/99, 698, 778, 780, 781, E33.001, E31.127
See application file for complete search history.

(56) References Cited

U.S. PATENT DOCUMENTS

| 7,989,270 B2 * | 8/2011 | Huang et al. .......... 438/127 |
| 2004/0188696 A1 | 9/2004 | Hsing Chen et al. |
| 2006/0278885 A1 | 12/2006 | Tain et al. |
| 2009/0273002 A1 | 11/2009 | Chiou et al. |

* cited by examiner

*Primary Examiner* — Hoai V Pham
(74) *Attorney, Agent, or Firm* — Haynes and Boone, LLP

(57) ABSTRACT

A light-emitting device (LED) package component includes an LED chip and a carrier chip. The carrier chip includes a first bond pad and a second bond pad on a surface of the carrier chip and bonded onto the LED chip through flip-chip bonding, and a third bond pad and a fourth bond pad on the surface of the carrier chip and electrically connected to the first bond pad and the second bond pad, respectively. The first bond pad and the second bond pad are on a same side of the carrier chip facing the LED chip. The carrier chip further includes at least one through substrate via (TSV) connected to the first and second bond pads.

20 Claims, 5 Drawing Sheets

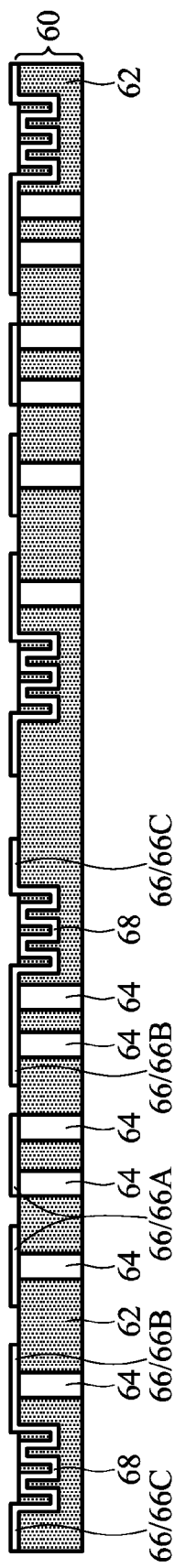
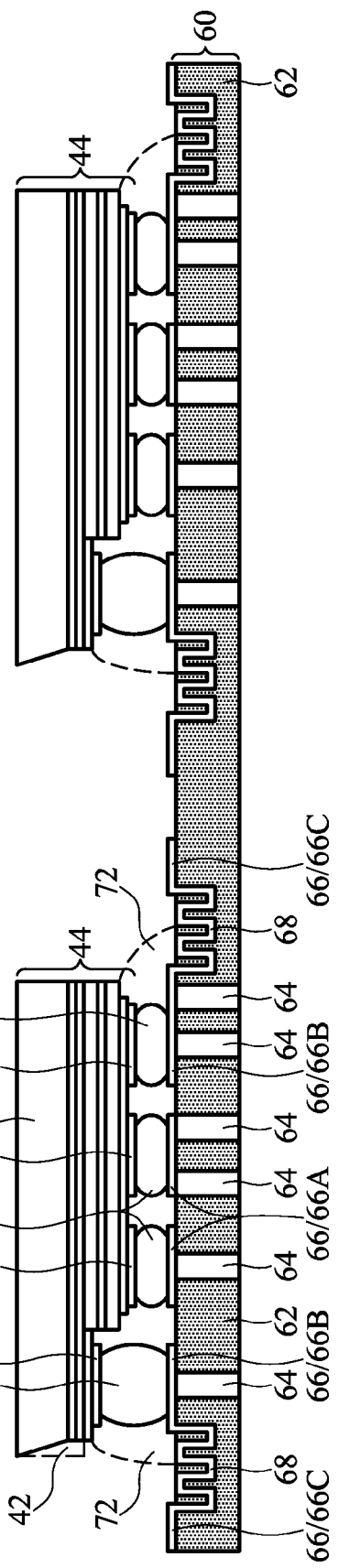
FIG. 3
FIG. 4

THERMALLY-ENHANCED HYBRID LED PACKAGE COMPONENTS

TECHNICAL FIELD

This disclosure relates generally to light-emitting device (LED) package components, and more particularly to LED package components including through-substrate vias (TSVs).

BACKGROUND

In recent years, optical devices, such as light-emitting diodes (LED), laser diodes, and UV photo-detectors have increasingly been used. Group-III nitride compounds, such as gallium nitride (GaN) and their related alloys, have been known suitable for the formation of the optical devices. The large bandgap and high electron saturation velocity of the group-III nitride compounds also make them excellent candidates for applications in high-temperature and high-speed power electronics.

Due to the high equilibrium pressure of nitrogen at typical growth temperatures, it is extremely difficult to obtain GaN bulk crystals. Therefore, GaN layers and the respective LEDs are often formed on other substrates that match the characteristics of GaN. Sapphire ($Al_2O_3$) is a commonly used substrate material. FIG. 1 illustrates a cross-sectional view of an LED package component. LED 2, which includes a plurality of GaN-based layers formed on sapphire substrate 4. Sapphire substrate 4 is further mounted onto lead frame 6. Electrodes 8 and 10 electrically connect LED 2 to lead frame 6 through gold wires 12.

It was observed that sapphire has a low thermal conductivity. Accordingly, the heat generated by LED 2 cannot be dissipated efficiently through sapphire substrate 4. Instead, the heat needs to be dissipated through the top end of LED 2 and through gold wires 12. However, since gold wires 12 are relatively long since they have to extend to lead frame 6, the heat-dissipating efficiency through gold wires 12 is also low. In addition, electrode 10 occupies chip area, and hence the LED light output area is not optimized.

SUMMARY

In accordance with one aspect, a light-emitting device (LED) package component includes an LED chip and a carrier chip. The carrier chip includes a first bond pad and a second bond pad on a surface of the carrier chip and bonded onto the LED chip through flip-chip bonding, and a third bond pad and a fourth bond pad on the surface of the carrier chip and electrically connected to the first bond pad and the second bond pad, respectively. The first bond pad and the second bond pad are on a same side of the carrier chip facing the LED chip. The carrier chip further includes at least one through substrate via (TSV) connected to the first and second bond pads.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2 through 6 are cross-sectional views of intermediate stages in the manufacturing of a package component including an LED in accordance with an embodiment.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel light-emitting device (LED) package component and the method of forming the same are presented. The intermediate stages of manufacturing an embodiment are illustrated. The variations of the embodiment are then discussed. Throughout the various views and illustrative embodiments, like reference numbers are used to designate like elements.

Figure 1:
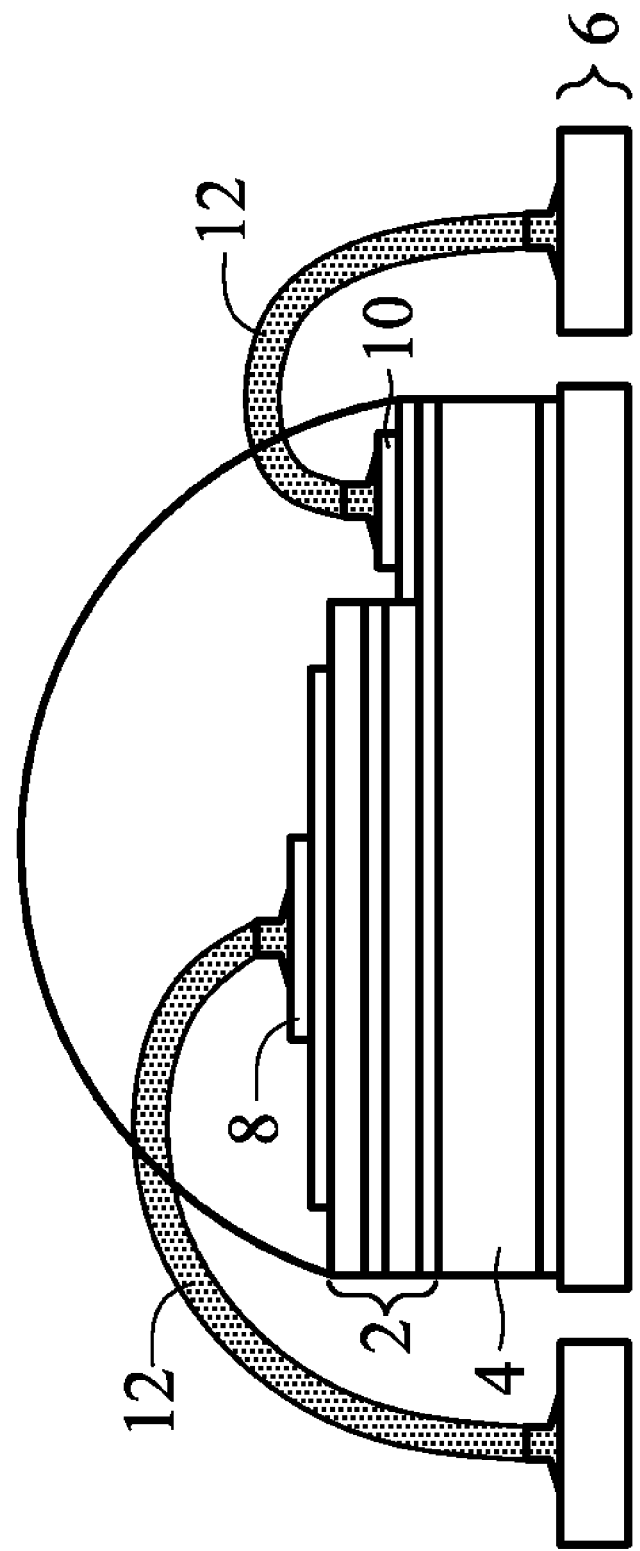
FIG. 1 illustrates a cross-sectional view of a conventional light-emitting device (LED) package structure formed on a sapphire substrate.
Figure 2:
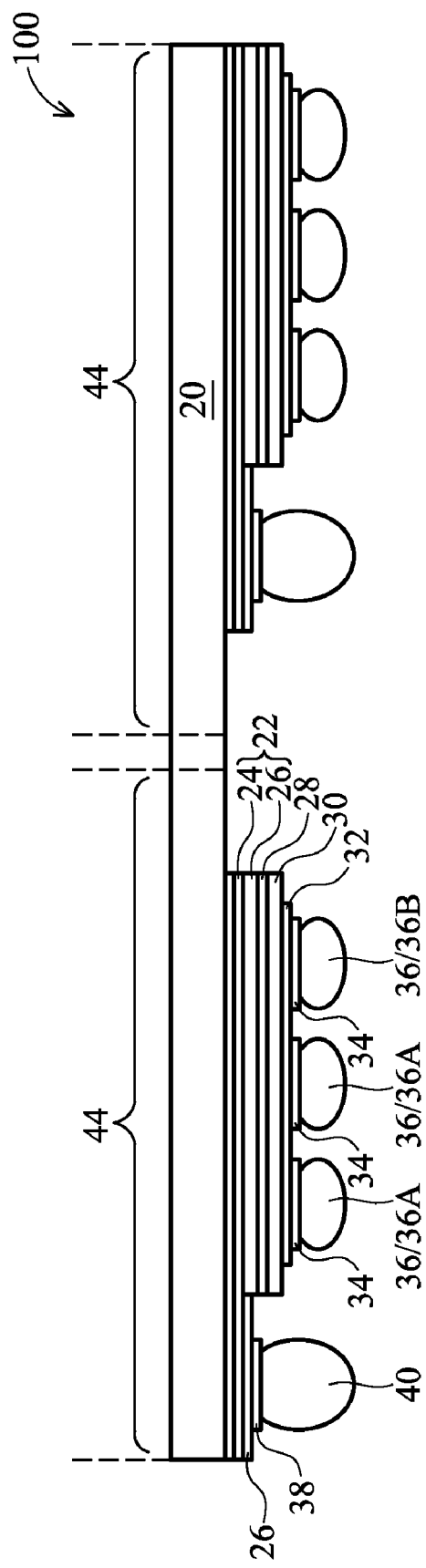

FIG. 2 illustrates wafer 100, which includes LEDs 22 formed on substrate 20. In an embodiment, substrate 20 is formed of sapphire ($Al_2O_3$, which is transparent), although it may also be formed of other materials having characteristics close to the characteristics of the layers in LEDs 22 (which may comprise group-III and group-V elements, or also known as III-V compound semiconductor materials). Substrate 20 may also be a silicon carbide substrate, a silicon substrate with a silicon carbide layer thereon, a silicon germanium substrate, or other applicable semiconductor substrates.

In an exemplary embodiment, un-doped gallium nitride (u-GaN) layer 24 is formed on, and possibly contact, substrate 20. In an embodiment, u-GaN layer 24 is substantially free from elements other than Ga and N. LEDs 22 are formed on, and may possibly contact, u-GaN layer 24. LEDs 22 may include a plurality of layers. In an exemplary embodiment, each of LEDs 22 include n-GaN layer (GaN doped with an n-type impurity) 26, multiple quantum well (MQW) 28, p-GaN layer (GaN doped with a p-type impurity) 30, reflectors 32, and top electrodes (which are also bond pads) 34. Reflectors 32 may be formed of a metal, for example. MQWs 28 may be formed of, for example, InGaN, and act as active layers for emitting light. The formation of layers 26, 28, 30, 32, and 34 are known in the art, and hence are not repeated herein. In an exemplary embodiment, the formation methods of layers 26, 28, and 30 include epitaxial growth. It is realized that LEDs 22 may have many designs and FIG. 2 only shows an exemplary version among the available variations. For example, the materials of each of layers 26, 28, and 30 may be different from the above-discussed materials, and may include ternary III-V compound semiconductor materials, such as GaAsP, GaPN, AlInGaAs, GaAsPN, AlGaAs, and the like. Also, the positions of n-GaN layer 26 and p-GaN layer 30 may be swapped.

Each of LEDs 22 further comprises bond pads 38, which are used to connect to n-GaN layer 26. Accordingly, bond pads 34 and 38 are used to apply a voltage to the respective LED 22, so that the respective LED 22 is activated to emit light. In an embodiment, at least one of electrodes 34 in each of LEDs 22 has a current flowing through during the usage (light emission) of LED 22, while one or more electrodes 34 are dummy electrodes, which do not have any current flowing through when the voltage is applied.

Solder bumps 36 (including active solder bumps 36B and dummy solder bumps 36A) and 40 are formed on LEDs 22. Solder bumps 36 and 40 may be formed of commonly used solder materials, such as lead-free solders, eutectic solders, or the like. After the formation of solder bumps 36 and 40, wafer 100 is diced into a plurality of LED chips 44, with each of LED chips 44 comprising one or more LED 22. In the embodiment wherein each LED chip 44 includes more than one LED chip 44 on a same substrate 20, the LEDs 22 in the same LED chips are referred to as LED tiles. After LED chips 44 are sawed from wafer 100, bevel cuts 42 (not shown in FIG. 2, please refer to FIG. 4) may be formed at the edges of LED chips 44, so that the respective edge forms a slant angle (not equal to 90 degrees) with the surface plane of the respective substrate 20. Bevel cuts 42 may reduce the stress in the resulting package structure.

Referring to FIG. 3, carrier wafer 60 is provided. Carrier wafer 60 comprises substrate 62, which may be a semiconductor substrate, such as a silicon substrate, or may be a dielectric substrate. Through-substrate vias (TSVs) 64 are formed in substrate 62, and electrically connect features on opposite sides of substrate 62. TSVs 64 may be formed of copper or other metals, such as tungsten, or alloys thereof. Bond pads 66 (including 66A, 66B, and 66C) are formed on one side of carrier wafer 60 and connect to TSVs 64.

TSVs 64 are dummy TSVs since they are not used to conduct currents, although voltages may be applied thereon. Throughout the description, dummy TSVs 64 are also referred to as thermal TSVs since they have the function of dissipating heat. Similarly, the bond pads 66 that have current flowing through during the light-emission of the respective LED chips 44 (after LED chips 44 are bonded onto carrier wafer 60) are referred to as active bond pads 66B or 66C, while the bond pads 66 that do not have current flowing through during the light-emission of the respective LED chips 44 are referred to as dummy bond pads 66A. Optionally, ohmic lines 68 are formed in or on carrier wafer 60 to interconnect bond pads, wherein ohmic lines 68 are used to regulate the current flowing through the LED chips 44 that will be bonded onto carrier wafer 60. Alternatively, no ohmic lines are formed, and the illustrated ohmic lines 68 are replaced by metal lines having negligible resistances, instead.

Referring to FIG. 4, a plurality of LED chips 44 diced from wafer 100 is flip-bonded onto carrier wafer 60. During the bonding process, solder bumps 36 and 40 are re-flowed. Both solder bumps 34 and 40 contact the respective bond pads 66 and 34/38. Optionally, underfill 72 is filled into the gaps between LED chips 44 and carrier wafer 60. During the dispensing of underfill 72, bevel cuts 42 are believed to facilitate underfill dispensing.

After LED chips 44 are bonded onto carrier wafer 60, active bond pads 66B may be covered (vertically overlapped) by LED chip 44. However, bond pads 66C are not covered by the respective LED chips 44. In other words, bond pads 66C vertically extend beyond the edges of the respective LED chips 44, and are not covered by underfill 72, if it is dispensed.

Figure 5:
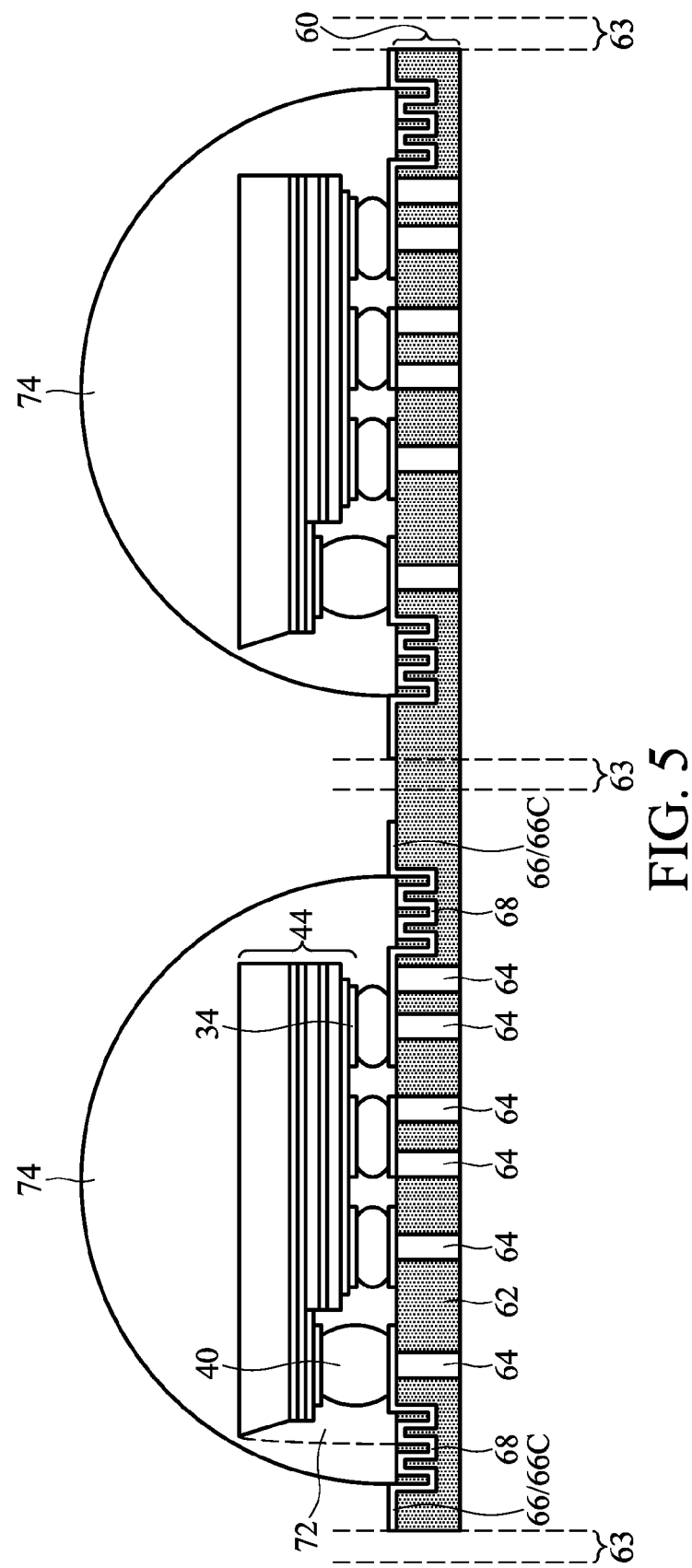

Referring to FIG. 5, silicone lenses 74 are molded onto LED chips 44. The molding of silicone lenses 74 is known in the art, and hence is not repeated herein. Each of silicone lenses 74 may cover the respective LED chips 44. In the case no underfill 72 is filled, silicone will also be filled into the gaps between LED chip 44 and carrier wafer 60, with silicone performing the function of underfill 72. Bond pads 66C are not covered by silicon lens 74, and are exposed.

Carrier wafer 60 may then be sawed apart along scribe lines 63, so that the LED package components are separated into individual packages. Accordingly, carrier wafer 60 is separated into a plurality of carrier chips 60' (please refer to FIG. 6), with each carrier chip 60' being bonded to at least one LED chip 44.

Figure 6:
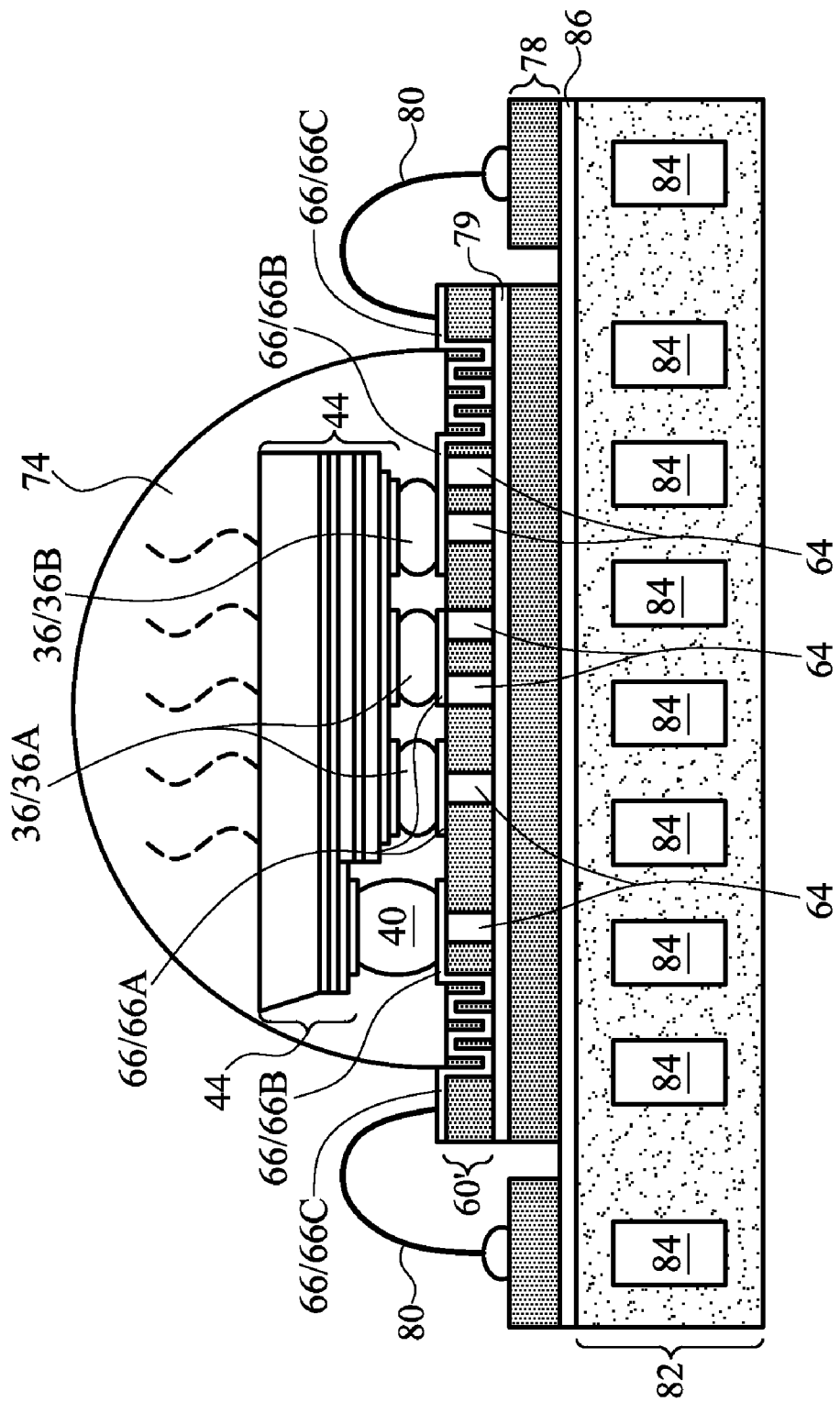

The package structure as shown in FIG. 5 includes bond pads 66C that can be used for wire bonding. FIG. 6 illustrates an exemplary package component after the wire-bonding is performed, in which the package component as shown in FIG. 5 may further be mounted onto lead frame 78. Bond pads 66C may be connected to lead frame 78 through conductive wires 80. Accordingly, through conductive wires 80, LED chips 44 are electrically connected to lead frame 78. Conductive wires 80 may be gold wires, although they may also be formed of other metallic materials, such as silver, aluminum, and the like.

The adhesion of carrier chip 60' to lead frame 78 may be achieved through thermal interface material (TIM) layer 79, which may be formed of a dielectric material that has a good thermal conductivity. In an exemplary embodiment, TIM layer 79 has a conductivity greater than about 33 W/mK, and may be between about 33 W/mK and about 318 W/mK. In an embodiment, TIM 79 is formed of an organic paste or pure alloy or metal, which can be dispensed onto lead frame 78, and thermal reflowed or cured after carrier chip 60' is mounted onto lead frame 78.

FIG. 6 further illustrates the mounting of the package component onto heat sink 82. In an embodiment, heat sink 82 and lead frame 78 are joined by TIM 86, which may be formed of a similar material as that of TIM layer 79. Heat sink 82 may include internal air ducts 84 to increase its heat dissipating area. Further, Heat sink 82 is used as a support for the package component mounted thereon, and is designed to be electrically isolated from the current I/Os. The heat generated in LED chips 44 may thus be dissipated to carrier chip 60' and then to heat sink 82. It is observed that in the path from LED chips 44 to heat sink 82, there is no material that has a low thermal conductivity. Accordingly, the thermal resistance between LED chips 44 and heat sink 82 is low, and the heat-dissipating efficiency of the package component as shown in FIG. 6 is high. The package component is thus suitable for being used for high-power LED devices where heat dissipation is important to optimal device operation.

It is observed that dummy solder bumps 36A do not have any current flowing through when a voltage is applied through wires 80 and bond pads 66C. However, dummy solder bumps 36A may help to conduct the heat generated in LED chips 44 through carrier chip 60' to heat sink 82.

The package component described in conjunction with FIG. 6 is referred to as being a hybrid package component since LED chips 44 are first bonded onto carrier chip 60' through flip-chip bonding, and the resulting structure is further bonded to other circuit components, such as a lead frame through wire-bonding. Such bonding scheme enables light to be emitted in one direction (for example, to the top in FIG. 6), and heat to be dissipated to the opposite direction (for example, to the bottom in FIG. 6). As a result, both the light-emitting efficiency and the heat-dissipating efficiency in accordance with various embodiments of the present invention are high and improved over conventional LED packages where the thermal path included materials having low thermal conductivity. For example, the heat generated in LED chips 44 may be dissipated through multiple dummy solder bumps 36A and thermal TSVs 64 into carrier chip 60'. Accordingly, the heat dissipating ability of the LED package component, as shown in FIG. 6, is improved. Further, the light generated by LED chip 44 is emitted through substrate 20 (with the exemplary sapphire substrate 20 being transparent), and is not blocked by any wire or bond pad. Accordingly, the light output efficiency is also improved over conventional LED packages where the light may be partially blocked by elements of the package.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A light-emitting device (LED) package component comprising:
    an LED chip; and
    a carrier chip comprising:
        a first bond pad and a second bond pad on a surface of the carrier chip and bonded onto the LED chip through flip-chip bonding;
        a third bond pad and a fourth bond pad on the surface of the carrier chip and electrically connected to the first bond pad and the second bond pad, respectively; and
        at least one through substrate via (TSV) connected to the first and second bond pads.

2. The LED package component of claim 1 further comprising a lens covering the LED chip and a portion of the carrier chip, with the third bond pad and the fourth bond pad not covered by the lens.

3. The LED package component of claim 1 further comprising a first bond wire and a second bond wire bonded onto the first bond pad and the second bond pad through the third bond pad and the fourth bond pad, respectively.

4. The LED package component of claim 3 further comprising:
    a lead frame bonded to the first bond wire and the second bond wire; and
    a thermal interface material (TIM) between and joining the carrier chip and the lead frame, wherein the TIM electrically insulates the lead frame from all TSVs in the carrier chip.

5. The LED package component of claim 1 further comprising a heat sink attached to the carrier chip, wherein the heat sink and the LED chip are on opposite sides of the carrier chip.

6. The LED package component of claim 1 further comprising:
    a dummy TSV in the carrier chip; and
    a dummy solder bump electrically connecting the dummy TSV to the LED chip.

7. The LED package component of claim 6, wherein the dummy TSV comprises a first end connected to the dummy solder bump, and a second end electrically insulated.

8. The LED package component of claim 1, wherein the LED chip comprises a bevel cut on an edge.

9. The LED package component of claim 1, wherein the carrier chip comprises an ohmic line electrically coupled between the first bond pad and the third bond pad.

10. The LED package component of claim 1, wherein the LED chip comprises:
    a transparent substrate;
    an active layer between the transparent substrate and the carrier chip; and
    a reflector between the active layer and the carrier chip.

11. A light-emitting device (LED) package component comprising:
    an LED chip;
    a carrier chip bonded onto the LED chip through flip-chip bonding, the carrier chip comprising a plurality of through substrate vias (TSVs);
    a first bond pad on a surface of the carrier chip;
    a second bond pad on the surface of the carrier chip and bonded onto the LED chip through flip-chip bonding, wherein the first bond pad and the second bond pad are electrically interconnected by an ohmic line;
    a lead frame with the carrier chip mounted thereon; and
    a conductive wire connecting the lead frame to the first bond pad.

12. The LED package component of claim 11 further comprising a lens covering the LED chip and a portion of the carrier chip, with the first bond pad not covered by the lens.

13. The LED package component of claim 11 further comprising a thermal interface material (TIM) between the carrier chip and the lead frame, wherein the TIM electrically insulates the lead frame from all TSVs in the carrier chip.

14. The LED package component of claim 11 further comprising:
    a heat sink, wherein the heat sink and the carrier chip are on opposite sides of the lead frame; and
    a TIM joining the heat sink and the lead frame.

15. The LED package component of claim 11 further comprising:
    a dummy TSV in the carrier chip; and
    a dummy solder bump electrically connecting the dummy TSV to the LED chip.

16. A light-emitting device (LED) package component comprising:
    a heat sink;
    a lead frame over and thermally coupled to the heat sink;
    a carrier chip over the lead frame, wherein the carrier chip comprises a plurality of dummy TSVs therein;
    a first thermal interface material (TIM) between the carrier chip and the lead frame, wherein the first TIM electrically insulates the lead frame from all of the plurality of dummy TSVs in the carrier chip;
    a first bond pad and a second bond pad on a surface of the carrier chip, wherein the first bond pad and the second bond pad are wire-bonded to the lead frame; and
    an LED chip over, and bonded onto, the carrier chip through flip-chip bonding, wherein two electrodes of the LED chip are electrically connected to the first bond pad and the second bond pad.

17. The LED package component of claim 16 further comprising a lens covering the LED chip and a portion of the carrier chip, with the first bond pad and the second bond pad not covered by the lens.

18. The LED package component of claim 16 further comprising a second TIM between the carrier chip and the lead frame.

19. The LED package component of claim 16, wherein the heat sink comprises a built-in air duct.

20. The LED package component of claim 16, wherein the plurality of dummy TSVs in the carrier chip are configured not to pass currents when the LED chip is activated to emit light, and wherein the plurality of dummy TSVs are bonded to electrodes on the LED chip through dummy solder bumps.

* * * * *